US012658254B2

(12) United States Patent　(10) Patent No.:　US 12,658,254 B2
Ambrosi et al.　(45) Date of Patent:　Jun. 16, 2026

(54) MEMORY SYSTEM AND OPERATING METHOD

(71) Applicant: Taiwan Semiconductor Manufacturing Company, Ltd., Hsinchu (TW)

(72) Inventors: Elia Ambrosi, Hsinchu City (TW); Cheng-Hsien Wu, Hsinchu City (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 116 days.

(21) Appl. No.: 18/403,739

(22) Filed: Jan. 4, 2024

(65) Prior Publication Data

US 2025/0022499 A1　Jan. 16, 2025

Related U.S. Application Data

(60) Provisional application No. 63/526,197, filed on Jul. 12, 2023.

(51) Int. Cl.
G11C 13/00　　(2006.01)
G11C 11/16　　(2006.01)
(52) U.S. Cl.
CPC ........ G11C 13/004 (2013.01); G11C 11/1673 (2013.01); G11C 11/1677 (2013.01); G11C 2013/0045 (2013.01)

(58) Field of Classification Search
CPC ........... G11C 11/1677; G11C 11/1673; G11C 2013/0045; G11C 2013/0054; G11C 2013/0057; G11C 13/004
See application file for complete search history.

(56) References Cited

U.S. PATENT DOCUMENTS

2015/0243352 A1* 8/2015 Park ................... G11C 13/0004
　　　　　　　　　　　　　　　　　　　　365/163
2020/0350371 A1* 11/2020 Pellizzer .............. H10N 70/841

* cited by examiner

*Primary Examiner* — Jay W. Radke
(74) *Attorney, Agent, or Firm* — JCIPRNET

(57) ABSTRACT

A memory system and an operating method are provided. The memory system comprises a memory array, a control circuit, and a read circuit. The memory array comprises a plurality of cross-point memory cells, and each cross-point memory cell comprises a selector and a memory element coupled in series between both terminals of the cross-point memory cell. The control circuit is coupled to the memory array, and the control circuit is configured to provide at least one read pulse each with an increasing magnitude to a selected cross-point memory cell. The read circuit is coupled to the memory array, and the read circuit is configured to receive a read current flowing through the selected cross-point memory cell and determines whether the read current is greater than a target current.

20 Claims, 12 Drawing Sheets

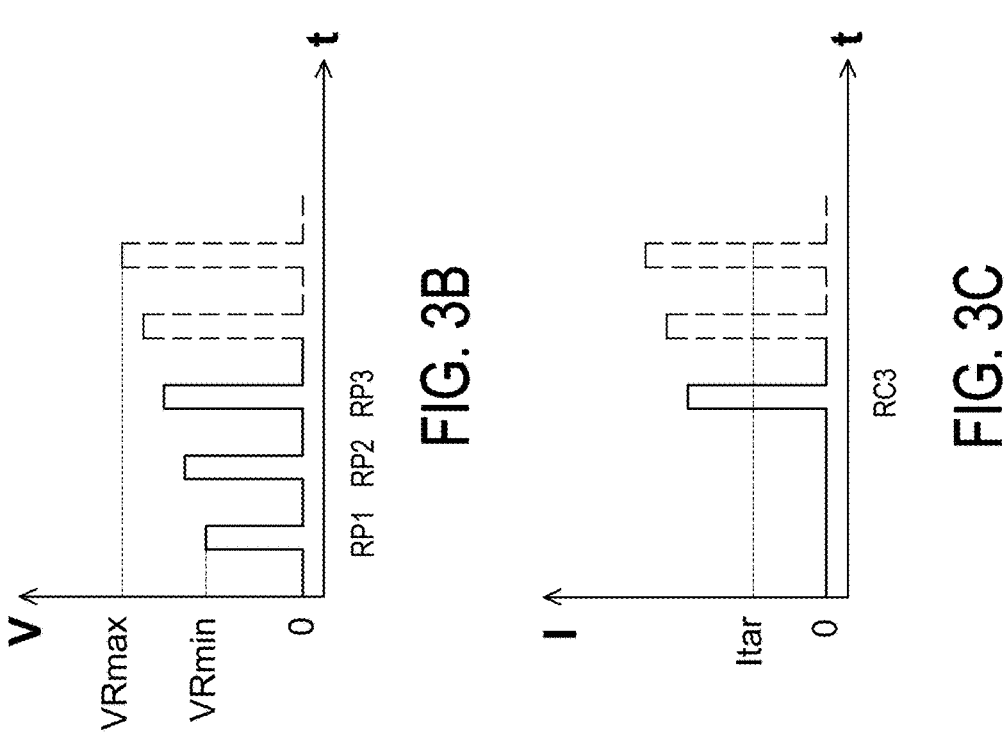
FIG. 3B
FIG. 3C
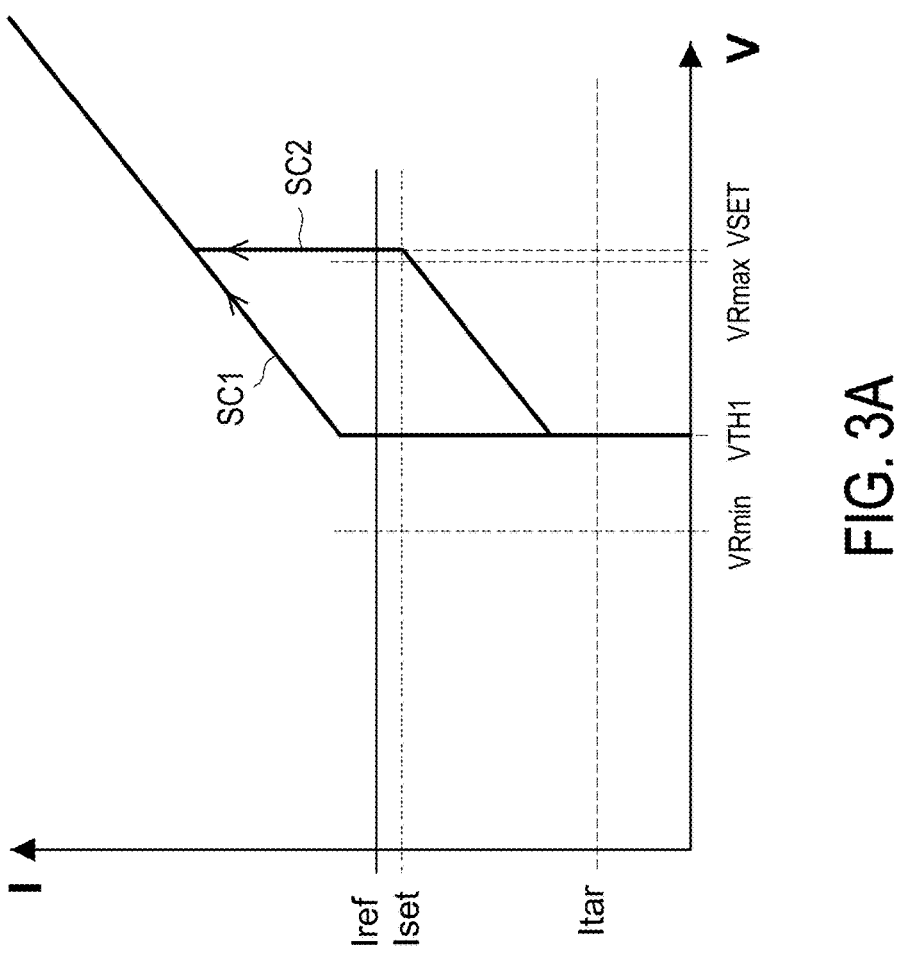
FIG. 3A

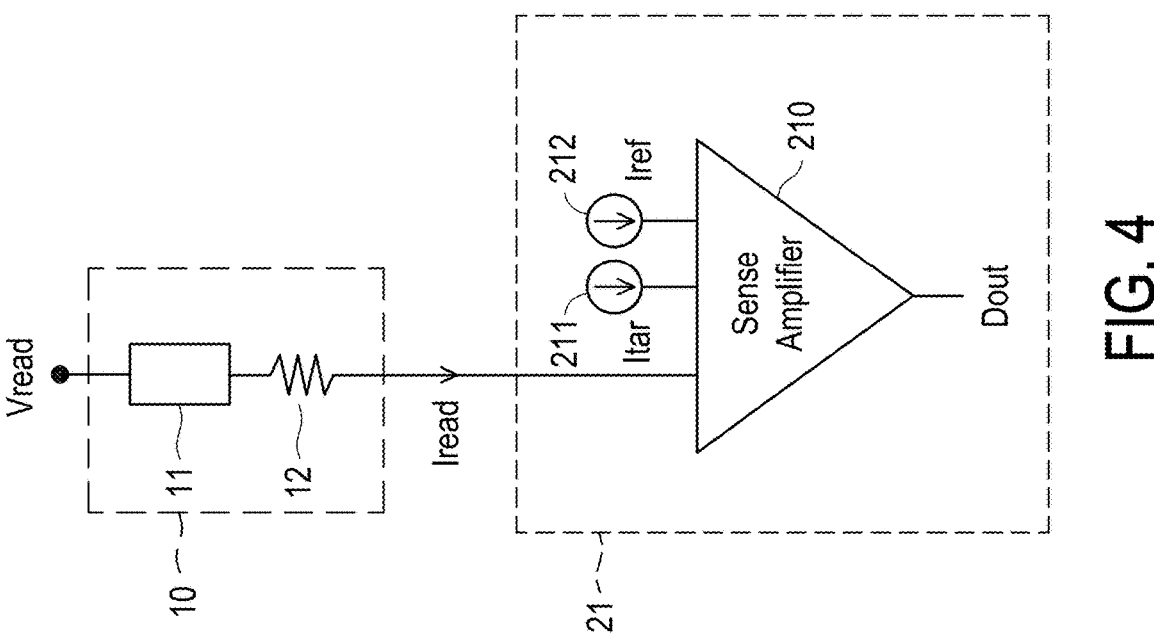
FIG. 4
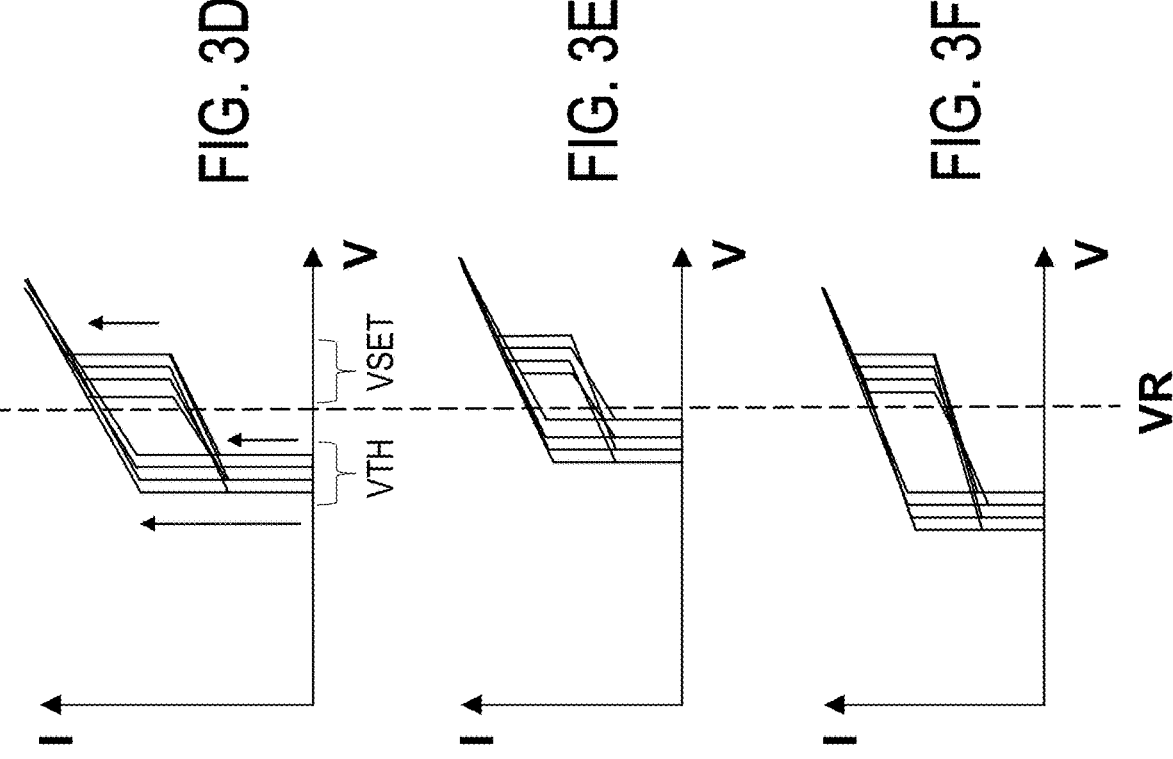
FIG. 3D
FIG. 3E
FIG. 3F

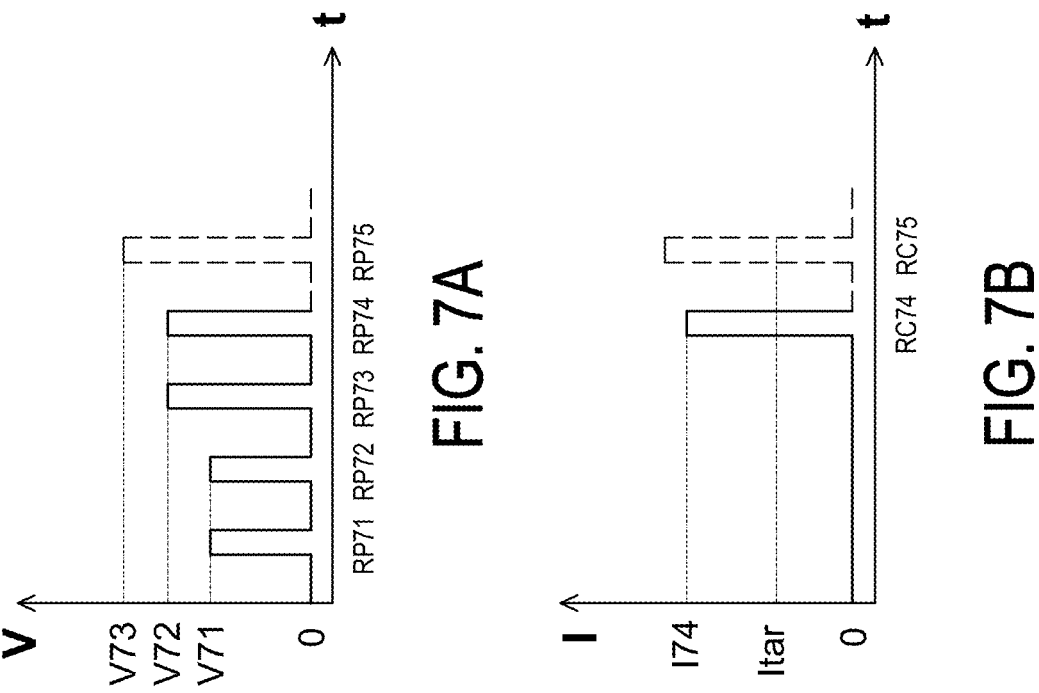
FIG. 7A
FIG. 7B
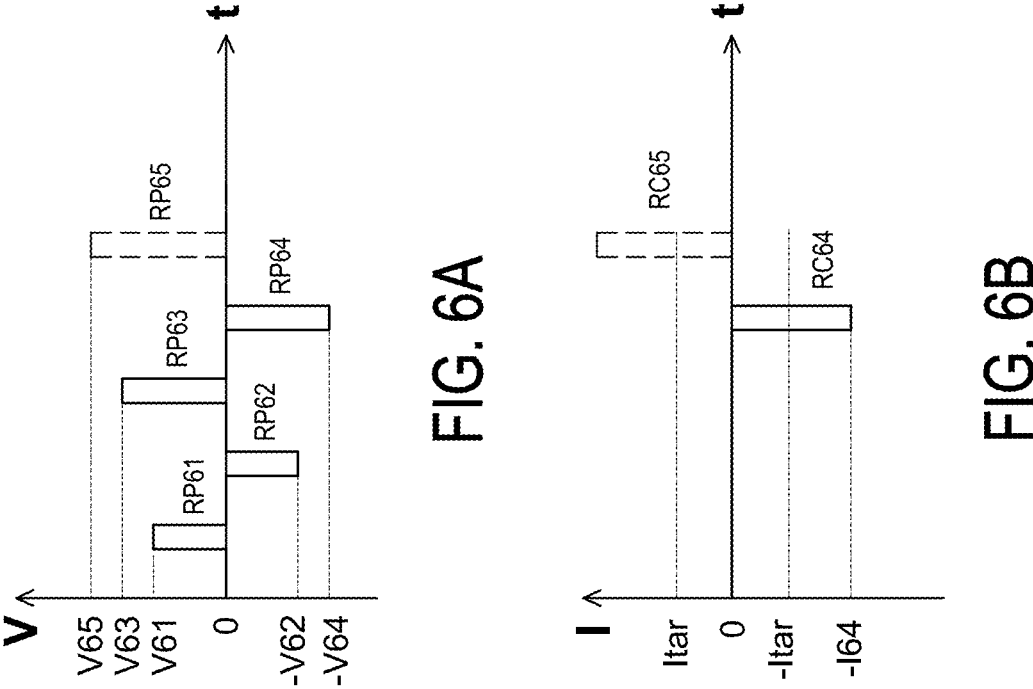
FIG. 6A
FIG. 6B provide at least one read pulse with an
increasing magnitude to a selected
XPoint memory cell     ~ S80 receive a read current flowing through the
selected XPoint memory cell and determine
whether the read current is greater than a
target current     ~ S81

MEMORY SYSTEM AND OPERATING METHOD

CROSS-REFERENCE TO RELATED APPLICATION

This application claims the priority benefit of U.S. provisional application Ser. No. 63/526,197, filed on Jul. 12, 2023. The entirety of the above-mentioned patent application is hereby incorporated by reference herein and made a part of this specification.

BACKGROUND

In a conventional read operation, how to set a constant read voltage which overcomes variations occurred on all memory cells for correctly reading out data from the memory cell is challenging. In addition, it is also hard to achieve a minimum read power utilizing such read voltage since the read voltage is usually significantly greater than the threshold voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C illustrates details of how a read operation is performed in the memory system in FIG. 2 according to some embodiments of the present disclosure.

FIGS. 3D-3F illustrate switching curves of cross-point memory cells of three difference electronic devices.

FIG. 4 illustrates a read circuit according to some embodiments of the present disclosure.

FIGS. 6A, 6B illustrate a series of read pulses provided to the selected cross-point memory cell and a corresponding read current received by the read circuit according to some embodiments of the present disclosure.

FIGS. 7A, 7B illustrate another series of read pulses provided to the selected cross-point memory cell and a corresponding read current received by the read circuit according to some embodiments of the present disclosure.

DESCRIPTION OF THE EMBODIMENTS

Figure 1A:
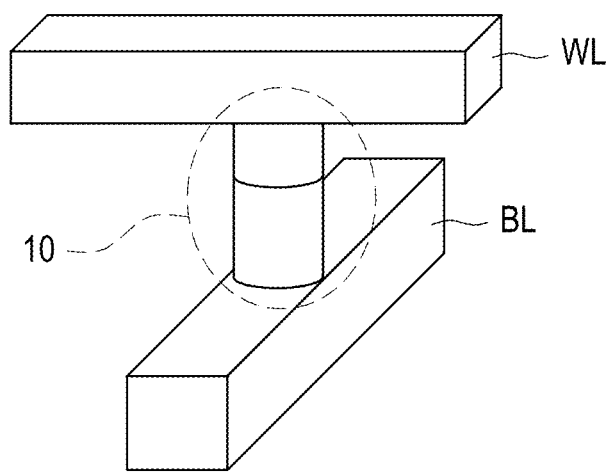
FIG. 1A illustrates a cross-point memory cell according to some embodiments of the present disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A illustrates a cross-point memory cell 10 according to some embodiments of the present disclosure. The cross-point memory cell 10 has two terminals, respectively coupled to a word line WL and a bit line BL. The word line WL and the bit line BL are respectively coupled to the two terminals of the cross-point memory cell 10. The cross-point memory cell 10 may be accessed according to a voltage difference of the two terminals applied from the word line WL and the bit line BL. For example, a read operation, a set operation, or a reset operation may be performed to the cross-point memory cell 10 according to the voltage difference applied to the two terminals across the cross-point memory cell. In at least one embodiment, it is possible to achieve one or more advantages including, but not limited to, less hardware design difficulty, compact memory size, or the like through simpler hardware structure of the cross-point memory cell 10.

Figure 1B:
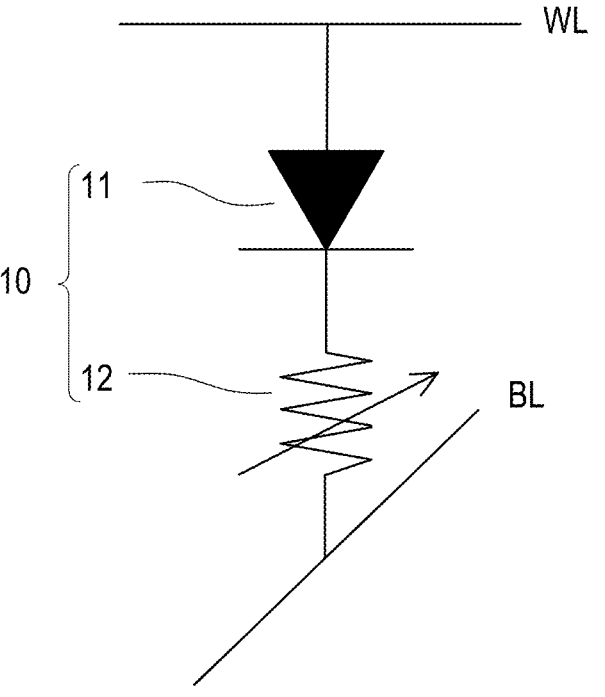
FIG. 1B illustrates a schematic of an equivalent circuit of the cross-point memory cell as illustrated in FIG. 1A according to some embodiments of the present disclosure.

FIG. 1B illustrates a schematic of an equivalent circuit of the cross-point memory cell 10 as illustrated in FIG. 1A according to some embodiments of the present disclosure. The two terminals of the cross-point memory cell 10 are respectively coupled to the word line WL and the bit line BL.

The cross-point memory cell 10 includes a selector 11 and a memory element 12. The selector 11 and the memory element 12 are serially coupled between the word line WL and the bit line BL. In at least one embodiment, the selector 11 is coupled to the word line WL, and the memory element 12 is coupled to the bit line BL.

In some embodiments, when the cross-point memory cell 10 is accessed through, for example but not limited to, the read operation, the set operation, or the reset operation, the selector 11 may function as a diode. The memory element 12 may be functioned as, for example but not limited to, a variable resistance. An anode of the diode in the equivalent circuit may be connected to the word line WL, and a cathode of the diode in the equivalent circuit may be connected to the variable resistance. The variable resistance in the equivalent circuit is coupled between the cathode of the diode and the bit line BL.

In some embodiments, the selector 11 may be bidirectional switching characteristic, which means that the selector may be turned on either by a positive or negative voltage difference between the word line WL and the bit line BL. Specifically, when the voltage difference between the word line WL and the bit line BL is positive, the selector 11 may be turned on or conductive when the voltage difference applied to the cross-point memory cell 10 is greater than or equal to a positive threshold voltage of the selector 11. When the voltage difference between the word line WL and the bit line BL is negative, the selector 11 may be turned on or conductive when the voltage difference applied to the cross-point memory cell 10 is less than or equal to a negative threshold voltage of the selector 11.

When the selector 11 is turned on or conductive, the data stored by the memory element 12 becomes accessible. When the selector 11 is cutoff or unconducted, the data stored by the memory element 12 becomes inaccessible. Therefore, when the selector 11 is turned on, the read operation, the set operation, or the reset operation may be performed to the memory element 12 for accessing the data stored thereby. Specifically, a resistance of the memory element 12 may be controlled at a low resistance state or a high resistance state to respectively store different data, and the stored data may be readout by performing the read operation to the cross-point memory cell 10. In some embodiments, when the set operation is performed, the resistance of the memory element 12 may be set at the high resistance state according to the applied voltage difference. In some embodiments, when the reset operation is performed, the resistance of the memory element 12 may be reset at the low resistance state according to the applied voltage difference. In some embodiments, when the read operation is performed, the resistance of the memory element 12 may be readout and evaluated in order for determining the data stored in the memory element 12.

In some embodiments, the memory element 12 may be a single-level cell (SLC), a multiple-level cell (MLC), a tri-level cell (TLC), a quadra-level cell (QLC) or the like. The memory element 12 may be, for example but not limited to, resistive random-access memory (ReRAM or RRAM), magnetic RAM (MRAM), phase change memory (PCM), flash memory comprising charge storage material or floating gate, or the like. Other types or configurations of memory elements are also within the scopes of various embodiments.

Figure 1C:
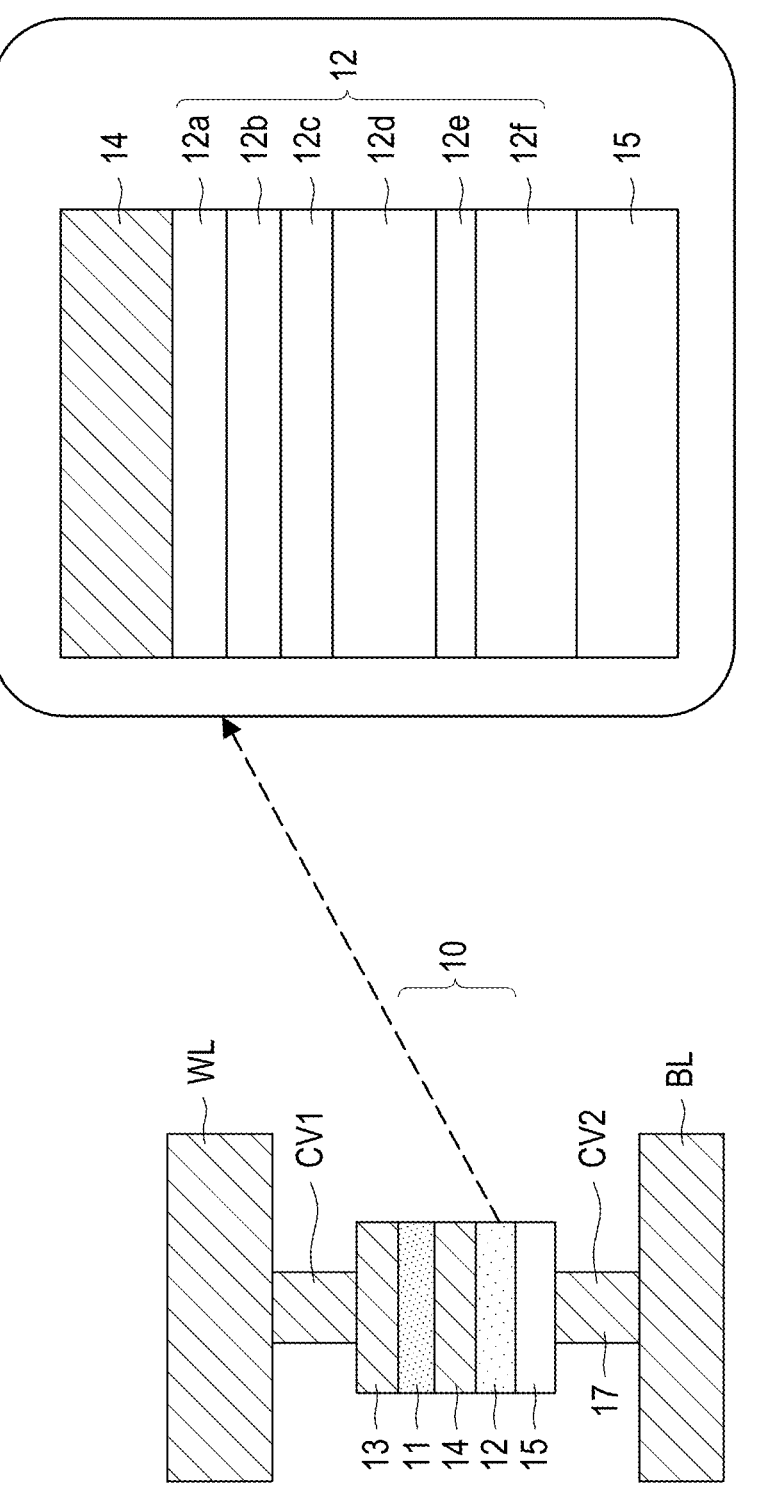
FIG. 1C illustrates a cross-sectional view of the cross-point memory cell as illustrated in FIG. 1A according to some embodiments of the present disclosure.

FIG. 1C illustrates a cross-sectional view of the cross-point memory cell 10 as illustrated in FIG. 1A according to some embodiments of the present disclosure. In this embodiment, the memory element 12 is an MRAM memory. The memory element 12 may be an SLC, and the resistance of the memory element 12 may be programmed to store data. However, persons skilled in the art may modify or adjust the cross-point memory cell 10 based on different design concepts, and thus other types of memories are also within the scopes of various embodiments.

Referring to FIG. 1A and left side of FIG. 1C, each memory cell 10 may include a selector 11 and a memory element 12. The selector 11 is sandwiched between electrodes 13, 14, while the memory element 12 is sandwiched between electrodes 14, 15.

In some embodiments, the electrode 13 may be functioned as a top terminal of the selector 11, and may be coupled to the word line WL through a conductive via CV1. In addition, the electrode 14 may function as a bottom terminal of the selector 11, and may be shared with the memory element 12. The electrodes 13, 14 are each formed of a conductive material. Similarly, the electrode 14 may function as the top terminal of the memory element 12; and the electrode 15 may function as the bottom terminal of the memory element 12, and may be coupled to the bit line BL through a conductive via CV2. As similar to the electrodes 13, 14, the electrode 15 is formed of a conductive material as well. For example, candidates of the conductive material may include Cu, W, TiN, TaN, Ru, AlN, Co, C, Si, or the like, or combinations thereof.

In some embodiments, the selector 11 may be controlled at a conducted state or at a cutoff state, providing accessibility to the memory cell 10. For example, when the selector 11 is controlled at the conducted state, the selector 11 is controlled to have a relatively low resistance, causing a resistance of the memory element 12 as well as the data stored therein to be accessible. On the other hand, when the selector 11 is controlled at the cutoff state, the selector 11 is controlled to have a relatively high resistance, causing the resistance of the memory element 12 as well as the data stored therein to be inaccessible. As an example, the selector 11 may include a chalcogenide compound. For instance, the selector 11 may include GeTe, GeCTe, AsGeSe, GeSbTe, GeSiAsTe, GeSe, GeSbSe, GeSiAsSe, GeS, GeSbS, GeSiAsS, NGeCTe, SiNGeCTe the like, or combinations thereof.

Specifically, a detailed structure of the memory element 12 is depicted on right side of FIG. 1C. In some embodiments, the electrode 14 is a single layer structure serving as the bottom terminal of the selector 11 and the top terminal of the memory element 12 at the same time. In some embodiments, the electrode 14 may be a multi-layer structure such that the top terminal of the selector 11 and the bottom terminal of the memory element 12 may be served by different layers of the electrode 14. In some embodiments, the memory element 12 of MRAM along with the selector bottom electrode 14 and the electrode 15 may also be referred as an MTJ stack structure. As can be seen on right side of FIG. 1C, the memory element 12 may include a capping layer 12a, a free layer 12b, a tunnel barrier 12c, a reference layer 12d, a coupling layer 12e, and a pinning layer 12f. The pinning layer 12f is disposed on the electrode 15, the coupling layer 12e is disposed on the pinning layer 12f, the reference layer 12d is disposed on the coupling layer 12e, the tunnel barrier 12c is disposed on the references layer 12d, the free layer 12b is disposed on the tunnel barrier 12c, the capping layer 12a is disposed on the free layer 12b, and the electrode 14 is disposed on the capping layer 12a. For example, the free layer 12b and the reference layer 12d may include CoFeB. The tunnel barrier layer 12c between the free layer 12b and the reference layer 12d may include MgO. The coupling layer 12e may include Ru and/or Ir. The pinning layer 12f may include $[\text{Pt/Co}_x]_n$.

In some MRAM devices, the relative orientation of the magnetization between the free layer 12c and the reference layer 12e is used to store one bit of information. For example, in some embodiments, if the free layer 12c and the reference layer 12e have the same magnetization alignment (parallel), the resultant low resistance state between the two layers is designated as a first state storing a first data value, and if the alignment is antiparallel, the resultant high resistance state between the free layer 12c and the reference layer 12e is designated as a second state storing a second data value. In some embodiments, the relative orientation of the magnetization is programmed based on the direction of the program current. Because the read current creates some disturbance on the magnetization in the two layers, the magnetization state that is programmed with a first program current in the same direction of the read current generally is subject to a smaller magnetization disturbance than the magnetization state that is programmed with a second program current in the opposite direction of the read current; consequently, the magnetization state that is programmed with the second program current is more susceptible to retention errors.

Figure 1D:
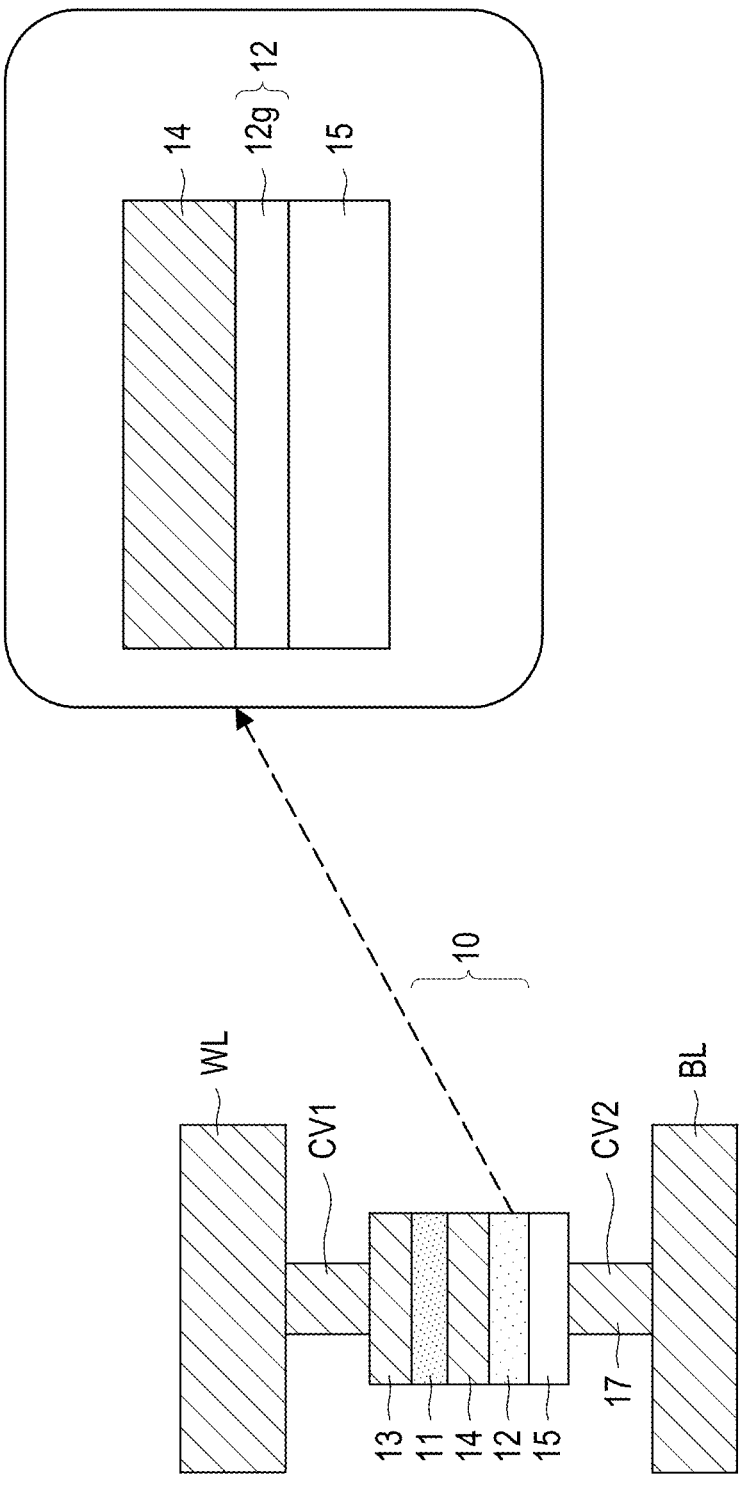
FIG. 1D illustrates a cross-sectional view of the cross-point memory cell as illustrated in FIG. 1A according to some embodiments of the present disclosure.

FIG. 1D illustrates a cross-sectional view of the cross-point memory cell 10 as illustrated in FIG. 1A according to some embodiments of the present disclosure. In this embodiment, the memory element 12 is an RRAM memory. The memory element 12 may be an SLC, and the resistance of the memory element 12 may be programmed to store data. However, persons skilled in the art may modify or adjust the cross-point memory cell 10 based on different design concepts, and thus other types of memories are also within the scopes of various embodiments.

Referring to FIG. 1A and left side of FIG. 1D, each memory cell 10 may include a selector 11 and a memory element 12. The selector 11 is sandwiched between electrodes 13, 14, while the memory element 12 is sandwiched between electrodes 14, 15.

In some embodiments, the electrode 13 may be functioned as a top terminal of the selector 11, and may be coupled to the word line WL through a conductive via CV1. In addition, the electrode 14 may be functioned as a bottom terminal of the selector 11, and may be shared with the memory element 12. The electrodes 13, 14 are each formed of a conductive material. Similarly, the electrode 14 may functioned as a top terminal of the memory element 12; and the electrode 15 may be functioned as the bottom terminal of the memory element 12, and may be coupled to the bit line BL through a conductive via CV2. As similar to the electrodes 13, 14, the electrode 15 is formed of a conductive material as well. For example, candidates of the conductive material may include Cu, W, TiN, TaN, Ru, AlN, Co, C, Si, Ti, Hf, Ta, Pt, or the like and combinations thereof.

In some embodiments, the selector 11 may be controlled at a conducted state or at a cutoff state, providing accessibility to the memory cell 10. For example, when the selector 11 is controlled at the conducted state, the selector 11 is controlled to have a relatively low resistance, causing a resistance of the memory element 12 as well as the data stored therein to be accessible. On the other hand, when the selector 11 is controlled at the cutoff state, the selector 11 is controlled to have a relatively high resistance, causing the resistance of the memory element 12 as well as the data stored therein to be inaccessible. As an example, the selector 11 may include a chalcogenide compound. For instance, the selector 11 may include GeTe, GeCTe, AsGeSe, GeSbTe, GeSiAsTe, GeSe, GeSbSe, GeSiAsSe, GeS, GeSbS, GeSiAsS, NGeCTe, SiNGeCTe the like, or combinations thereof.

Specifically, a detailed structure of the memory element 12 is depicted on right side of FIG. 1D. In some embodiments, the electrode 14 is a single layer structure serving as the bottom terminal of the selector 11 and the top terminal of the memory element 12 at the same time. In some embodiments, the electrode 14 may be a multi-layer structure such that the top terminal of the selector 11 and the bottom terminal of the memory element 12 may be served by different layers of the electrode 14. The memory element 12 of RRAM along with the selector bottom electrode 14 and the electrode 15 may also be referred as a RRAM stack structure. As can be seen on right side of FIG. 1D, the memory element 12 may include a dielectric layer 12g. For example, the dielectric layer 12g may be a single layer structure include $HfO_x$, $AlO_x$, $TaO_x$, $SiO_x$, $AlN_x$, or other suitable materials, or may be a bilayer structure including combinations of materials above.

In some embodiments, the memory element 12 of RRAM may be based on filament type or an interface type of RRAM devices. Taking the filament type RRAM devices as an example, the change of the resistance of a specially formulated dielectric material is used to store one bit of information. For example, in some embodiments, the forming of filaments changes the conductivity of the dielectric material in a capacitor, and the controlled formation and destruction of filaments allows the storage of different data values.

Figure 1E:
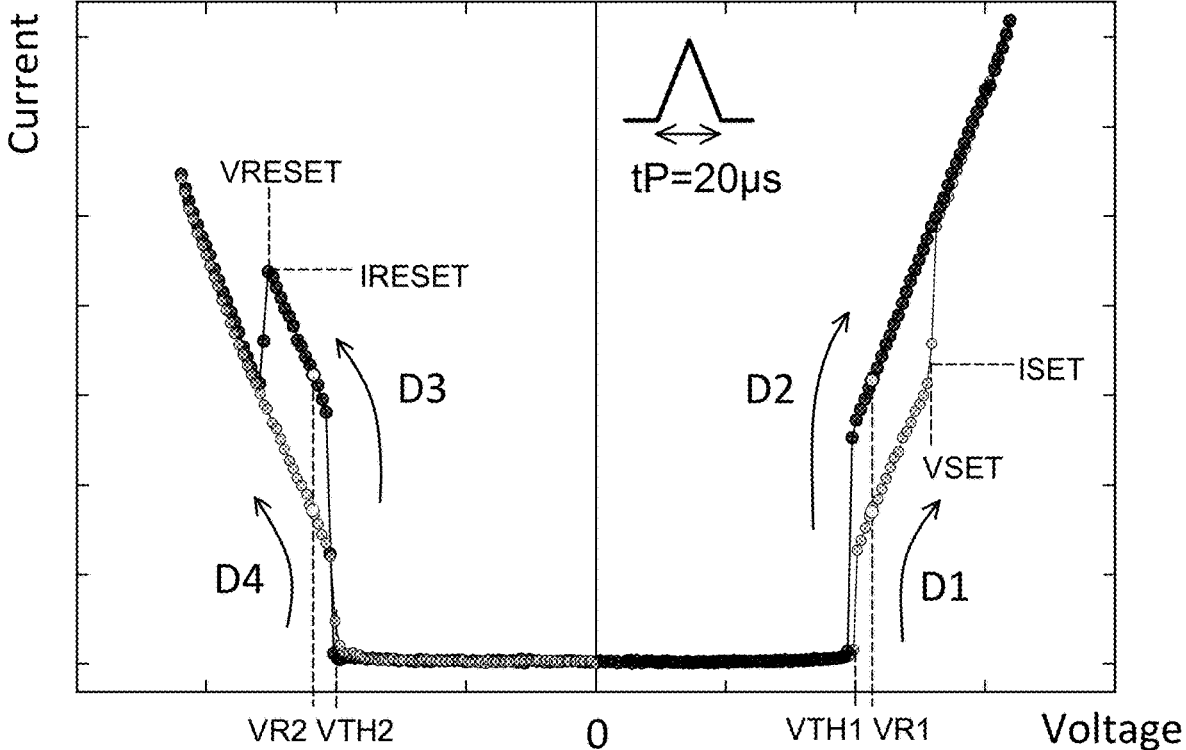
FIG. 1E illustrates switching curves of the cross-point memory cell as illustrated in FIG. 1A according to some embodiments of the present disclosure.

FIG. 1E illustrates switching curves of the cross-point memory cell 10 as illustrated in FIG. 1A according to some embodiments of the present disclosure. Particularly, a voltage and current relationships of the cross-point memory cell 10 is illustrated in FIG. 1E, showing the bidirectional operations of the cross-point memory cell 10 under the forward and negative bias voltages. In FIG. 1E, a horizontal axis shows the voltage difference applied to the cross-point memory cell 10, and a vertical axis shows the corresponding current flowing through the cross-point memory cell 10.

It is noted that when the voltage difference between the word line WL and the bit line BL is a positive voltage, a voltage of the word line WL is greater than a voltage of the bit line BL. When the voltage difference between the word line WL and the bit line BL is positive, the selector 11 is operated under a forward biased voltage. On the contrary, when the voltage difference between the word line WL and the bit line BL is negative, a voltage of the word line WL is less than a voltage of the bit line BL. When the voltage difference between the word line WL and the bit line BL is negative, the selector 11 is operated under a reverse biased voltage.

In some embodiments, the cross-point memory cell 10 may have a hysteresis characteristic in both the positive and negative voltage regions. In an example that the voltage difference applied to the cross-point memory cell 10 is positive, the selector 11 kept cutoff or nonconductive when the applied voltage difference is less than a threshold voltage VTH1 of the selector 11. As the voltage difference increases, the selector 11 is turned on or conductive when the applied voltage difference is greater than or equal to the threshold voltage VTH1. The conductive selector 11 causes the current flowing through the cross-point memory cell 10 to rise. More particularly, the current flowing through the cross-point memory cell 10 may rise to different current levels according to a resistance which the memory element 12 is set or reset. When the memory element 12 is set at the high resistance state, the current of the cross-point memory cell 10 rises to a lower current level following a direction D1. On the contrary, when the memory element 12 is set at the low resistance state, the current of the cross-point memory cell 10 rises to a higher current level following a direction D2. Therefore, the data stored in the cross-point memory 10 may be readout according to a level of the current flowing through the cross-point memory cell 10 when a read voltage VR1 greater than the threshold voltage VTH1 of the selector 11 is applied to the cross-point memory cell 10.

Moreover, as the applied voltage difference continues to go up and exceeds a set voltage VSET of the memory element 12, the applied high voltage difference may change the memory element 12, which is at the high resistance state, to the low resistance state. Particularly, when the voltage difference applied on the cross-point memory cell 10 passes the set voltage VSET, a drastic rise of the current flowing through the cross-point memory cell 10 can be observed for the cross-point memory cell 10 at the high resistance state. Therefore, the set operation is implemented, causing the cross-point memory cell 10 at the high resistance state to be changed to the low resistance state by applying the voltage difference greater than the set voltage VSET.

In another example, wherein the voltage difference applied to the cross-point memory cell 10 is negative, the selector 11 kept is cutoff or nonconductive when the applied voltage difference is lower in magnitude than a magnitude of threshold voltage VTH2 of the selector 11. As the voltage difference decreases (becomes more negative and greater in magnitude), the selector 11 is turned on or conductive when the applied voltage difference is greater in magnitude than or equal to the magnitude of threshold voltage VTH2. The conductive selector 11 causes the current flowing through the cross-point memory cell 10 to rise to different current levels along directions D3, D4 respectively corresponding to the low and high resistance states. Therefore, the stored data may be readout by analyzing the current level of the current flowing through the cross-point memory cell 10 when a read voltage VR2 less than the threshold voltage VTH2 (when the magnitude of VR2 is greater than the magnitude of VTH2) of the selector 11 is applied.

Moreover, as the applied voltage difference continues to go down until the voltage applied voltage difference exceeds a reset voltage VRESET of the memory element 12, the applied large voltage difference may change the memory element 12 from the low resistance state to the high resistance state. Particularly, when the voltage difference applied on the cross-point memory cell 10 passes the reset voltage VRESET, a drastic drop of the current flowing through the cross-point memory cell 10 can be observed for the cross-point memory cell 10 at the low resistance state. Therefore, the reset operation is implemented, causing the cross-point memory cell 10 at the low resistance state to be changed to the high resistance state by applying the voltage difference less than the reset voltage VRESET.

Figure 1F:
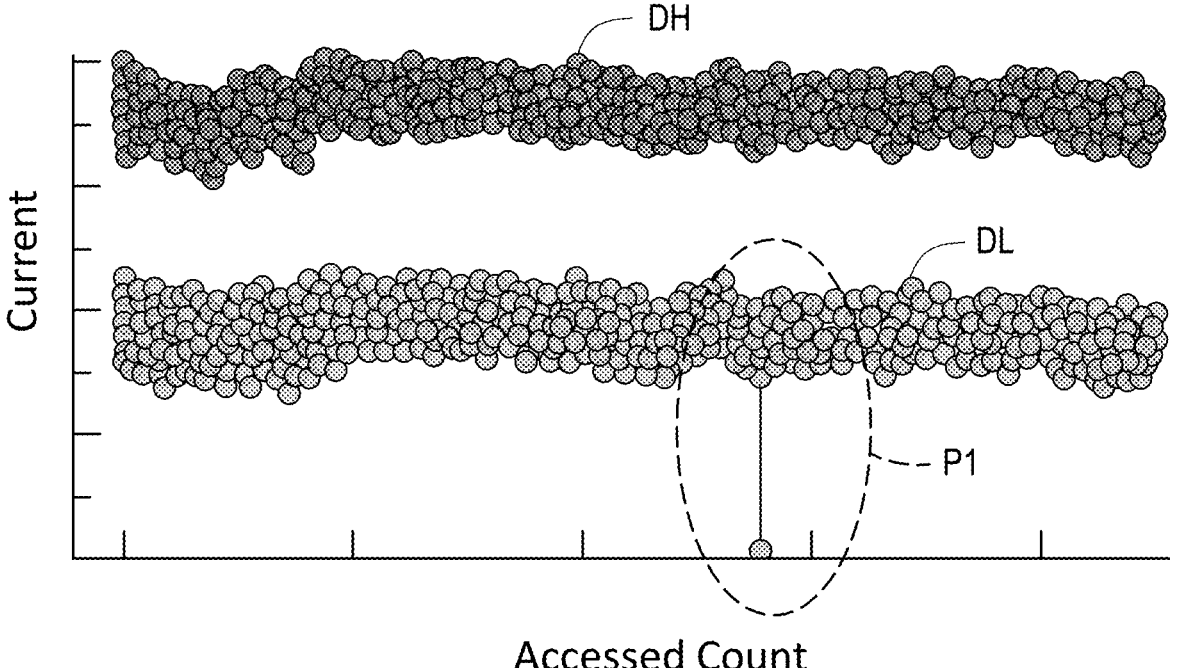
FIG. 1F illustrates distributions of a current flowing through the cross-point memory cell of different resistance states with respect to an accessed count of the cross-point memory cell according to some embodiments of the present disclosure.

FIG. 1F illustrates distributions DH, DL of a current flowing through the cross-point memory cell 10 of different resistance states with respect to an accessed count of the cross-point memory cell according to some embodiments of the present disclosure. In some embodiments, the accessed count is how many time the selector 11 of the cross-point memory cell 10 has been switched from cutoff to conducted.

In FIG. 1F, the distributions DH, DL respectively corresponding to the currents flowing through the cross-point memory cell at the low and high resistance states 10 are illustrated. As can be seen in FIG. 1F, the distributions DH, DL are roughly maintained at two current levels respectively correspond to the currents flowing through the cross-point memory cell at the low and high resistance states 10. For the cross-point memory cells 10 at the low and high resistance states, the currents are stably kept at two different current levels while the accessed count increases, except a protrusion P1 in the current L2. Specifically, the protrusion P1 shows a failed read operation performed on the cross-point memory cell 10 that data stored in the cross-point memory cell 10 is unable to be readout. The selector 11 remains unconducted and little or no current is flowing through the cross-point memory cell 10 even if the applied voltage difference exceeds the threshold voltage of the selector 11. However, the read operation performed on the cross-point memory cell 10 fails temporarily only for one time, and quickly returns to normal at next access cycle to the cross-point memory cell 10.

Figure 2:
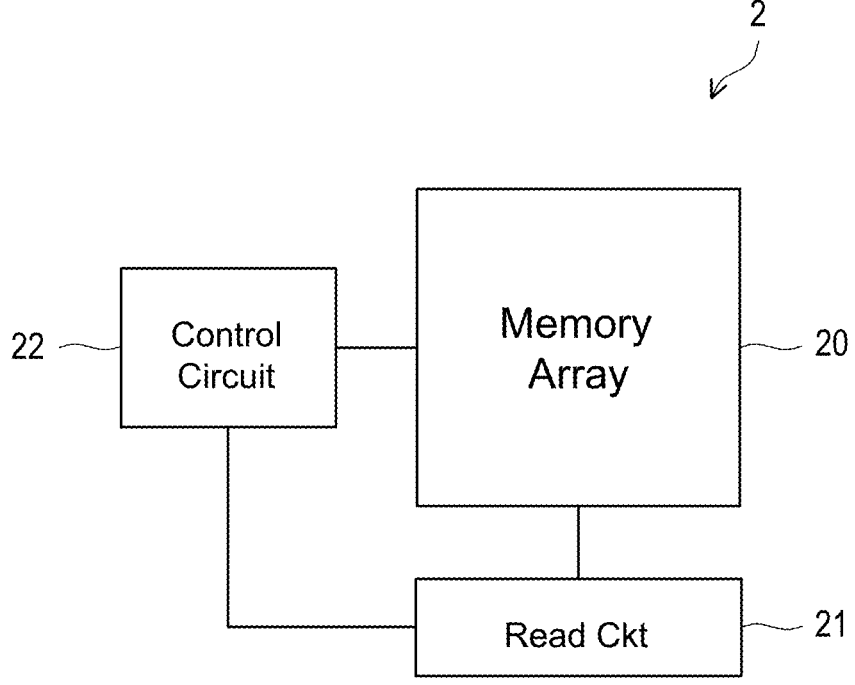
FIG. 2 illustrates a memory system according to some embodiments of the present disclosure.

FIG. 2 illustrates a memory system 2 according to some embodiments of the present disclosure. The memory system 2 includes a memory array 20, a read circuit 21, and a control circuit 22. The memory array 20 is formed by a plurality of cross-point memory cells 10 as described in relation to FIGS. 1A-1D. The memory cross-point memory cells 10 are arranged in rows, columns, and layers, thereby forming the memory array 20 with a three-dimensional structure, which will be described with greater details in the paragraphs below. The control circuit 22 is coupled to the memory array 20 for providing read pulses to the memory array 20 for accessing data. In some embodiments, the control circuit 22 may be, for example but not limited to, a pulse generator, configured to generate the read pulses at predetermined amplitudes according to instructions. The read circuit 21 is coupled to the memory array 20, and configured to receive and analyze a read current flowing through a selected cross-point memory cell 10, to readout data stored in the selected cross-point memory cell 10 when a read pule is provided from the control circuit 22 to the selected cross-point memory cell 10 during performing a read operation. More particularly, when performing the read operation, the control circuit 22 is configured to provide the read pulses with an increasing magnitude to the selected cross-point memory cell. The read circuit 21 is configured to sense the read current flowing through the selected cross-point memory cell 10 each time the read pulse is provided from the control circuit 22. Then, the read circuit 21 compares each read current with a target current Itar. When it is determined that the read current is greater than the target current Itar, the read circuit 21 may send a verification signal to the control circuit 22 that the data stored by the cross-point memory cell 10 is successfully readout by the read current, and the read operation performed to the selected cross-point memory cell 10 is completed.

FIGS. 3A-3C illustrates details of how a read operation is performed in the memory system 2 in FIG. 2 according to some embodiments of the present disclosure. FIG. 3A illustrates switching curves SC1, SC2 similar to the switching curves of a cross-point memory cell 10 in a positive voltage region as illustrated in FIG. 1D. With regard to the switching curves SC1, SC2, it is shown that the selector 11 of the cross-point memory cell 10 is turned on or conductive when the applied voltage difference is greater than the threshold voltage VTH1. After the selector 11 is turned on, the current flowing through the cross-point memory cell 10 rises to one of two different current levels respectively corresponding to the high and low resistance states of the cross-point memory cell 10. As the applied voltage difference increases, the two different current levels increase along substantially a same slope. When the applied voltage difference reaches the set voltage VSET, the current flowing through the cross-point memory cell 10 of the high resistance state rises to a same current level of the low resistance state. In other words, the applied voltage difference greater than the set voltage may change the cross-point memory cell 10 from the high resistance state to the low resistance state, realizing the set operation.

FIG. 3B illustrates magnitudes of the read pulses provided to the selected cross-point memory cell 10 during performing the read operation. Correspondingly, FIG. 3C illustrates corresponding current levels when the read pulses in FIG. 3B are provided to the selected cross-point memory cell 10. Please refer to FIGS. 3A, 3B for better understanding how the read pulses are provided to the selected cross-point memory cell 10. When the read operation is performed, the control circuit 22 is configured to repeatedly provide the read pulse with the increasing magnitude to the selected cross-point memory cell 10. Specifically, the control circuit 22 may provide the read pulses starting from a first magnitude VRmin, and gradually increasing the read pulses until a magnitude reaches a second magnitude VRmax. In some embodiments, the first magnitude VRmin may be selected from a voltage level between 0.8V-0.9V and the second magnitude may be selected from a voltage level between 1.3V-1.5V. In general, the first and second magnitudes VRmin and VRmax would depend on the threshold voltage range and memory technology write (or disturb) voltage, respectively, and depend on the specific implementation. Thus, the suggested ranges are merely examples, and it is also possible to select the magnitude from other ranges as the technology migrates. Referring to FIG. 3A, the first magnitude VRmin may be less than the threshold voltage VTH1 of the selector 11 of the cross-point memory cell 10. The second magnitude VRmax may be greater than the threshold voltage VTH1 and smaller than the set voltage of the cross-point memory cell 10.

Please refer to FIGS. 3A, 3C for better understanding how the data is read by analyzing the read current flowing through the selected cross-point memory cell 10. Specifically, the read circuit 21 may compare the read current flowing through the selected cross-point memory cell 10 with the target current Itar each time the read pulse is provided. As can be seen in FIG. 3A, the target current Itar is set at a current level slightly lower than a lowest current level of the low resistance state of the cross-point memory cell 10. In some embodiments, target current Itar is selected from a current level between 5-20 uA. Therefore, when the read circuit 21 receives the read current greater than the target current Itar, the read circuit 21 may accordingly determine that the selector 11 of the selected cross-point memory cell 10 is successfully turned on, and thus the read current successfully corresponds to a state in which the cross-point memory cell 10 is set or reset. The read circuit 21 may compare the current level of the read current with a reference current Iref to determine a data value stored in the selected cross-point memory cell 10. As can be seen in FIG. 3A, the reference current Iref is set at a current level between two turning points of the switching curves SC1, SC2. Therefore, after the read circuit 21 determines that the current level of the read current is greater than the target current Itar, the read circuit 21 may provide a verification signal to inform the control circuit 22 that the read operation being performed to such selected cross-point memory cell 10 is successful, so that the control circuit 22 may reset the magnitude of the pulse signal which it sends for accessing another selected cross-point memory cell 10 thereafter.

In the example illustrated in FIGS. 3B, 3C, the magnitude of the read pulses RP1-RP3 are gradually increased starting from the first magnitude VRmin and provided from the control circuit 22 to the selected cross-point memory cell 10. As can be seen in FIGS. 3B, 3C, when the starting two read pulses RP1, RP2 are provided, there is no current flowing through the selected cross-point memory cell 10 and received by the read circuit 21. However, when the third read pulse RP3 is provided to the selected cross-point memory cell 10, a read current RC3 with a current level greater than the target current Itar. Accordingly, the read circuit 21 may verify that the read current RC3 is greater than the target current Itar, so that the verification signal may be sent to the control circuit 22 to quit sending following read pulses to the selected cross-point memory cell 10. Further, the read circuit 21 may obtain the data value stored in the selected cross-point memory cell 10 by comparing the read current RC3 with the reference current Iref. As a result, the read operation performed to the selected cross-point memory cell 10 may be completed in response to receiving the read current RC1 greater than the target current Itar, so that the control circuit 22 may stop sending read pulses illustrated in dotted lines in FIG. 3B after the read pulse RP3.

In some embodiments, the read operation performed in the memory system 2 minimizes a read power and a read disturbance. FIGS. 3D-3F illustrate switching curves of cross-point memory cells of three difference electronic devices. As can be seen in FIG. 3D, the threshold voltages and set voltages of the cross-point memory cells differ due to process variations. Under such a circumstance, it becomes challenging to find out and set a global read voltage VR against variations on all cross-point memory cells, since the global read voltage must be selected to be greater than all threshold voltages and less than all set voltages of all cross-point memory cells. If the selected global read voltage fails to fit in the narrow voltage margin, erroneous data value may be obtained during the read operation. Even the global read voltage may be determined, the global read voltage is usually determined at a magnitude significantly greater than the threshold voltage, making it hard to maintain a minimum read power when performing the read operation. Moreover, the high read voltage is more likely to cause bit flip to other cross-point memory cells sharing the same signal lines, thereby deteriorating a read disturbance rate.

In comparison, the read operation performed by the memory system 2 may apply the read voltage (i.e., the voltage difference applied across the cross-point memory cell 10) be gradually incremented starting from the first magnitude VRmin less than the threshold voltage VTH1. Therefore, the read operation may be conducted by the read voltage adaptively selected at a minimum magnitude overcoming all process voltage and temperature (PVT) variations, so it is possible to achieve one or more advantages including, but not limited to, minimizing a read power and a read disturb rate, or the like when performing the read operation.

FIG. 4 illustrates a read circuit 21 according to some embodiments of the present disclosure. The read circuit 21 may be utilized in the memory system 2 in FIG. 2 to receive and analyze a read current Iread from the selected cross-point memory cell 10 to determine what the stored data value is. The read circuit 21 includes a sense amplifier 210 and current sources 212, 213. Specifically, the sense amplifier 210 is configured to receive the read current Iread and compare the read current Iread with the target current Itar and the reference current Iref to generate an output data Dout.

Specifically, the sense amplifier 210 may compare the read current Iread with the target current Itar to determine whether the selector 11 of the cross-point memory cell 10 is successfully turned on or conductive by the read current Iread. When the comparison result shows that the read current Iread is greater than the target current Itar, it can be determined that the selector 11 is turned on or conductive by the read current Iread, so the sense amplifier 21 may compare the read current Iread with the reference current Iref to determine at which state the cross-point memory cell 10 is and what data value it stores.

In some embodiments, the current source 212 is a fixed current source and configured to provide the reference current Iref at a fixed current level as illustrated in FIG. 3A. As can be seen in FIG. 3A, the reference current Iref stays at about the same level regardless changes of the voltage difference applied to the cross-point memory cell 10. Since the reference current Iref provides a reference current level for analyzing whether the read current Iread flowing through the selected cross-point memory cell 10 is at the high or low resistance state, the reference current Iref is preferably selected at a current level between a bottom portion of the switching curve SC2 and a top portion of the switching curve SC1 within the threshold voltage VTH1 and the set voltage VSET. Therefore, the reference current Iref divides the currents of the high resistance state from that of the low resistance state, and thus the sense amplifier 210 may utilize the reference current Iref for analyzing the data value stored by the selected cross-point memory cell 10, thereby generating an output data Dout corresponding to the data value stored by the selected cross-point memory cell 10.

Figure 5B:
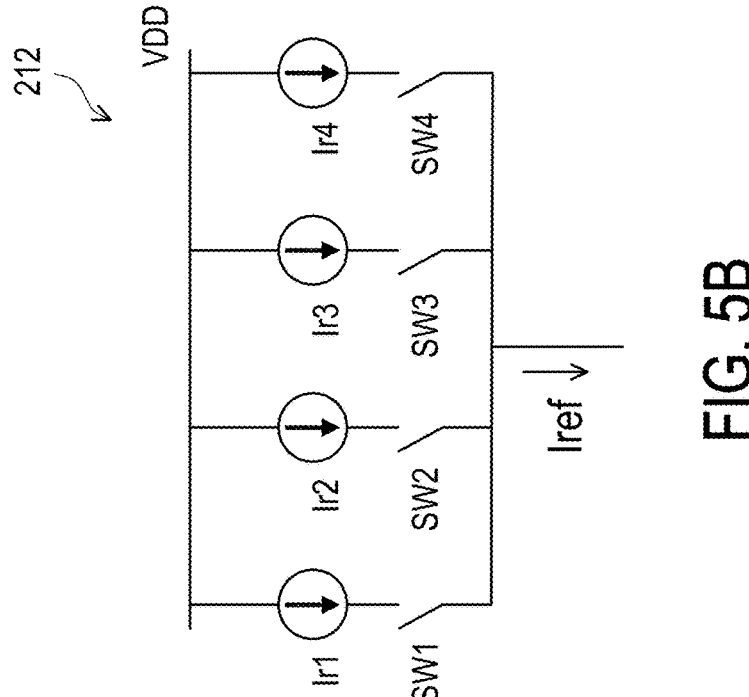
FIG. 5B illustrates a current source configured to generate the reference current Iref following the relationship curve illustrated in FIG. 5A according to some embodiments of the present disclosure.
Figure 5A:
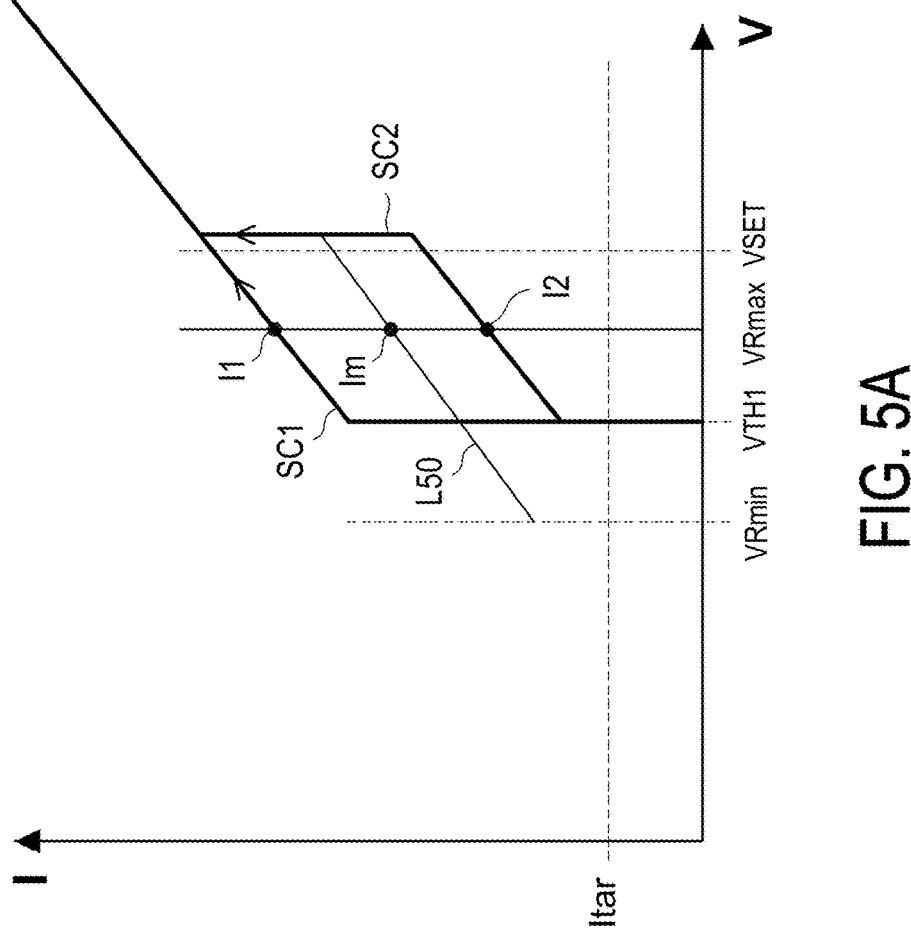
FIG. 5A illustrates a relationship curve L50 between a reference current Iref and the voltage difference applied to a selected cross-point memory cell 10 according to some embodiments of the present disclosure.

FIG. 5A illustrates a relationship curve L50 between a reference current Iref and the voltage difference applied to a selected cross-point memory cell 10 according to some embodiments of the present disclosure. In some embodiments, the current source 212 is a dynamic current source, and configured to provide the reference current Iref at a current level dynamically adjusted according to the voltage difference applied to the cross-point memory cell 10. As can be seen in FIG. 5A, the reference current Iref is increased together with the applied voltage difference within the threshold voltage VTH1 and the set voltage VSET. In some aspect, the reference current Iref is positively correlated with the read voltage Vread applied to the selected cross-point memory cell 10 since the reference current Iref increases as the applied read voltage increases. The switching curves SC1, SC2 of the selected cross-point memory cell 10 as illustrated in FIG. 3A are also shown in FIG. 5A for reference. In some embodiments, the relationship curve L50 is set parallel to the switching curves SC1, SC2 within the threshold voltage VTH1 and the set voltage VSET. In some embodiments, the relationship curve L50 is set at between the switching curves SC1, SC2. In some embodiments, the relationship curve L50 is set at a midpoint between the switching curve SC1, SC2. Specifically, a vertical line is illustrated in FIG. 5A intersecting the switching curves SC1, SC2, and the relationship curve L50 respectively at currents I1, I2, Im. Since the relationship curve L50 is set at the midpoint between the switching curves SC1, SC2, the current Im equals to an average of the currents I1, I2. In other words, by setting the relationship curve L50 at the midpoint between the switching curves SC1, SC2, a distance from the relationship curve L50 to both switching curves SC1, SC2 are averaged, thereby lowering accuracy requirements to the sense amplifier 210.

FIG. 5B illustrates a current source 212 configured to generate the reference current Iref following the relationship curve L50 illustrated in FIG. 5A according to some embodiments of the present disclosure. The current source 212 includes a plurality of sub-current sources Ir1-Ir4 respectively coupled to switches SW1-SW4. The switches SW1-SW4 selectively sum output currents of the sub-current sources Ir1-Ir4 and provide the summed current as at the output node as the reference current Iref. In such example, the current source 212 may function like a digital-to-analog (DAC) converter which is configured to convert digital control signals into the analog reference current Iref, such that the current level of the reference current Iref may be controlled by the control signals to generate linear relationship between the reference current Iref and the applied voltage difference.

FIGS. 6A, 6B illustrate a series of read pulses provided to the selected cross-point memory cell 10 and a corresponding read current received by the read circuit 21 according to some embodiments of the present disclosure. In this embodiment, the control circuit 22 is configured to provide the read pulses alternating between positive and negative voltages. The control circuit 22 provides the read pulses RP61-RP64 alternating between positive and negative voltages, where the read pulses RP61, RP63 have positive voltage and the read pulses RP62, RP64 have negative voltages. The read pulses RP61-RP64 have gradually increased magnitudes V61-V64. As can be seen in FIG. 6B, the read circuit 21 receives a read current RC64 when the read pulse RP64 is provided to the selected cross-point memory cell 10. Specifically, since the read pulse RP64 has the negative voltage, the read current RC64 has a negative current accordingly. The magnitude 164 of the read current RC64 is greater than the target current Itar, such that the read circuit 21 may send a verification signal to inform the control circuit 22 that the data stored by the cross-point memory cell 10 is successfully readout through the read current RC64. Thus, the control circuit 22 may decide that the read operation to the selected cross-point memory cell 10 is successful and thus quits sending read pulse RP65 subsequent to the read pulse RP64.

Refer to FIG. 1D, the selector 11 of the selected cross-point memory cell 10 may have bidirectional switching characteristics. That means the selector 11 may be turned on or conductive by either the positive or negative voltage differences. The selector 11 may be turned on or conductive by the positive voltage greater than the threshold voltage VTH1, or by the negative voltage less than threshold voltage VTH2 (more negative than that of VTH2). However, the bidirectional switching characteristics of the cross-point memory cell 10 may or may not be symmetric. If the threshold voltages VTH1, VTH2 are inequivalent and the magnitude of the threshold voltage VTH1 is greater in magnitude than that of the threshold voltage VTH2, applying the read pulse on the voltage region which attains larger threshold voltage will cause extra power consumption. Under such a circumstance, the read operation may be aimed to search the voltage region which attains the lower threshold voltages. By applying the read pulse alternatingly and increasing the magnitude gradually, lower side of the threshold voltages VTH1, VTH2 will be reached first. In other words, minimum read power can be assured by applying the read pulses alternatingly.

FIGS. 7A, 7B illustrate another series of read pulses provided to the selected cross-point memory cell 10 and a corresponding read current received by the read circuit 21 according to some embodiments of the present disclosure. In some embodiments, during providing the read pulses RP71-RP74, each read pulse is repeated before increasing its magnitude. Specifically, as can be seen in FIG. 7A, the control circuit 22 repeats the read pulse RP71, such that the read pulse RP72 having the same magnitude V71 as the read pulse RP71 is provided to the selected cross-point memory cell 10, and the read pulses PR73, RP74 having the same magnitude V72 are provided to the selected cross-point memory cell subsequently. In this embodiment, the control circuit 22 repeats the read pulse with the same magnitude for twice. However, in other embodiments, the control circuit 22 may repeat the read pulse for a preset number of times. As can be seen in FIG. 7B, the read circuit 21 receives the read current RC74 with a magnitude 174 greater than the target current Itar when the read pulse RP74 is provided to the selected cross-point memory cell 10. Specifically, the read circuit 21 receives the read current RC74 when the read pulse RP74, which is submitted by the control circuit 22 submitted for repeating the read pulse RP73, is provided.

Particularly, the read pulse RP73 may be explained by the protrusion P1 as illustrated in FIG. 1E, such that the failed read operation may be occurred occasionally as the cross-point memory cell 10 ages. Under such a circumstance, the read pulse will be repeated at the same magnitude for a preset number of times to overcome the failed read operation and achieve the minimized read power consumption.

In some embodiments, since the failed read operation occurs due to aging, the read operation with repeated read pulse may be executed after an accessed count of the selected cross-point memory cell is greater than or equal to a preset accessed count. In some embodiments, the read operation with repeated read pulse may be executed periodically taking the preset accessed count as a period.

Figure 8:
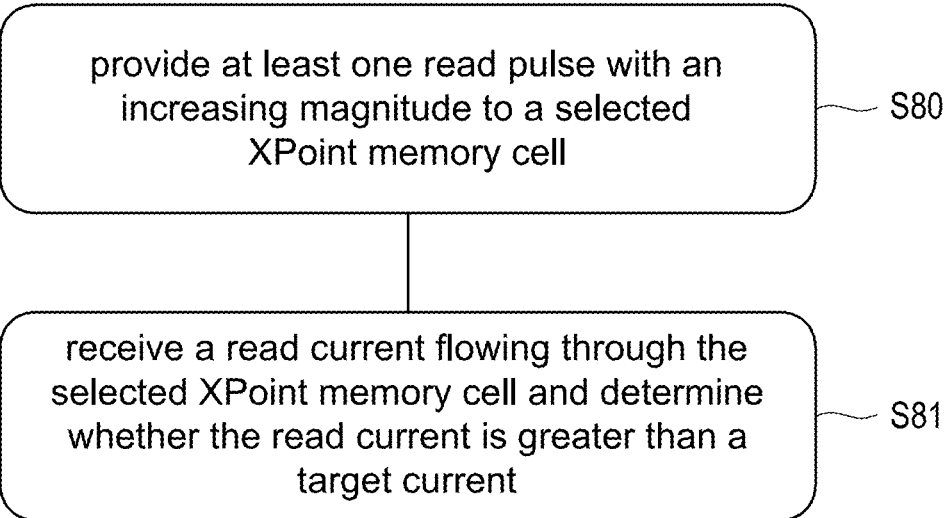
FIG. 8 illustrates a flow chart of an operating method of a memory array in FIG. 2 according to some embodiments of the present disclosure.

FIG. 8 illustrates a flow chart of an operating method of a memory array 20 in FIG. 2 according to some embodiments of the present disclosure. The operating method may be applied and executed by the memory system 2 in FIG. 2. The operating method includes steps S80, S81. In step S80, the control circuit 22 provides at least one read pulse with an increasing magnitude to a selected cross-point memory cell 10. In step S81, the read circuit 21 receives a read current flowing through the selected cross-point memory cell 10 and determine whether the read current is greater than a target current. Specifically, the target current is set lower than a current level of a current flowing through the cross-point memory cell 10 at a high resistance state. In some embodiments, the target current is selected from a current between 5-20 uA for properly determining whether a selector 11 of the selected cross-point memory cell 10 is turned on or conductive. By the read pulse with the gradually increased magnitude and the target current, the operating method may effectively minimize a read power and a read disturbance.

Figure 9:
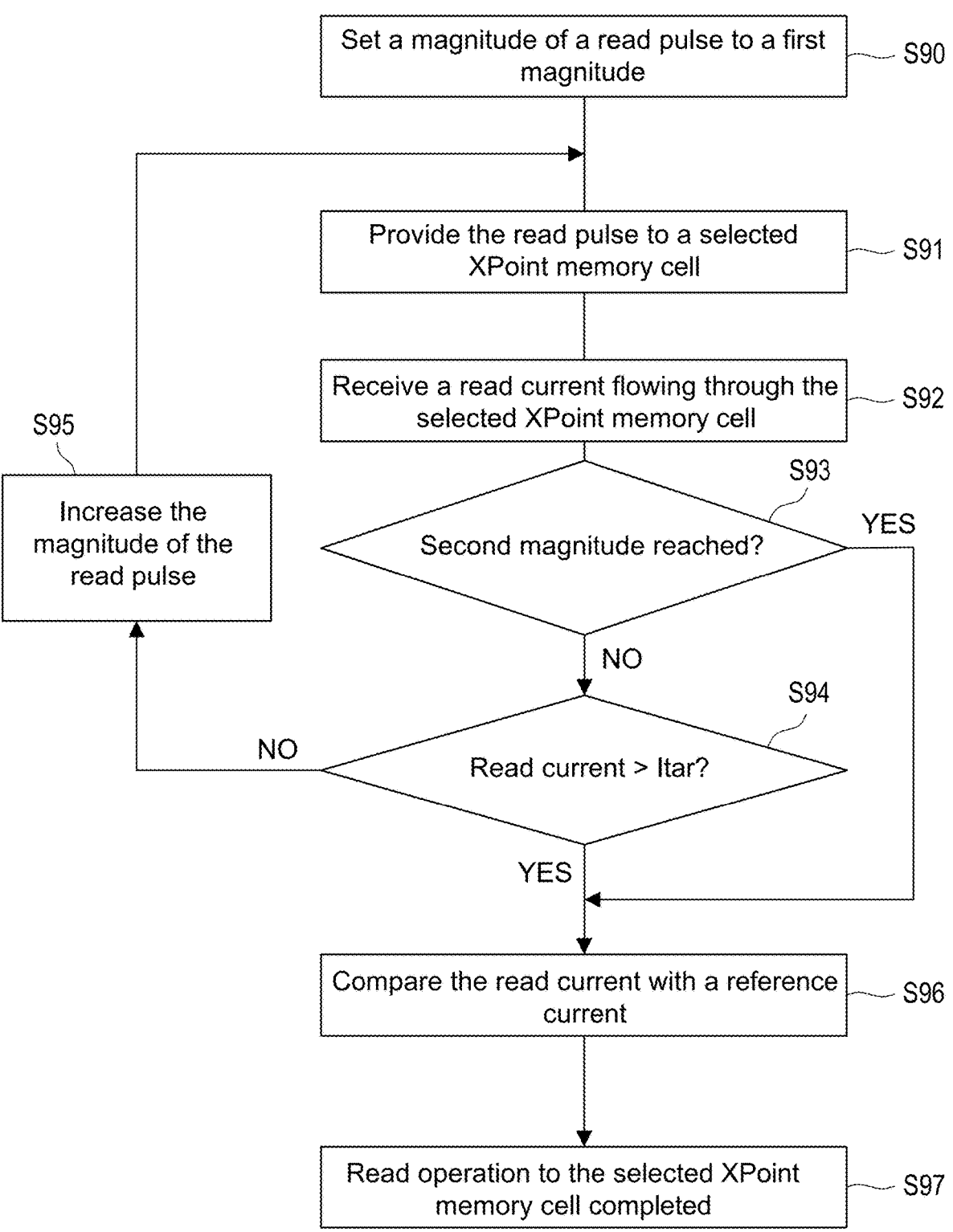
FIG. 9 illustrates a flow chart of an operating method of a memory array in FIG. 2 according to some embodiments of the present disclosure.

FIG. 9 illustrates a flow chart of an operating method of a memory array 20 in FIG. 2 according to some embodiments of the present disclosure. The operating method may be applied and executed by the memory system 2 in FIG. 2. The operating method includes steps S90-S97.

In step S90, a magnitude of a read pulse to a first magnitude.

In step S91, the read pulse with the first magnitude is provided by a control circuit 22 to a selected cross-point memory cell 10.

In step S92, a read circuit 21 receives a read current flowing through the selected cross-point memory cell 10.

In step S93, the control circuit 22 evaluates whether the magnitude reaches a second magnitude. If the result is no, the operating method goes to step S94. Otherwise, the operating method jumps to step S95.

In step S94, the read circuit 21 compares the read current with a target current to determine whether a selector 11 of the selected cross-point memory cell is successfully turned on or conductive. If the result is yes, the operating method goes to step S96. If the result is no, the operating method goes to step S95.

In step S95, when it is determined that the read current is less than the target current, it represents that the selector 11 of the selected cross-point memory cell 10 is not turned on or conductive, so the magnitude of the read pulse will be increased to go over again the steps S91-S94. The loop formed by steps S91-S95 will be terminated when it is determined that the read current is greater than the target current, or the magnitude of the read pulse reaches the second magnitude, which is a preset magnitude upper bound of the read pulse.

In step S96, the read circuit 21 compares the read current with a reference current to determine a data value stored in the selected cross-point memory cell 10.

In step S97, after determining the data value, the read operation performed to the selected cross-point memory cell 10 may be completed.

In some embodiments, a memory system comprises a memory array, a control circuit, and a read circuit. The memory array comprises a plurality of cross-point memory cells, and each cross-point memory cell comprises a selector and a memory element coupled in series between both terminals of the cross-point memory cell. The control circuit is coupled to the memory array, and the control circuit is configured to provide at least one read pulse each with an increasing magnitude to a selected cross-point memory cell. The read circuit is coupled to the memory array, and the read circuit is configured to receive a read current flowing through the selected cross-point memory cell and determines whether the read current is greater than a target current.

In some embodiments, a memory system comprises a memory array, a control circuit, and a read circuit. The memory array comprises a plurality of cross-point memory cells, and each cross-point memory cell comprises a selector and a memory element coupled in series between both terminals of the cross-point memory cell. The control circuit is coupled to the memory array, the control circuit is configured to provide at least one read pulse to a selected cross-point memory cell, wherein a magnitude of each read pulse is increased from a first magnitude lower than a threshold voltage of the selected cross-point memory cell to a second magnitude between a set voltage and the threshold voltage of the selected cross-point memory cell. The read circuit is coupled to the memory array, and the read circuit is configured to receive a read current.

In some embodiments, an operating method is used for operating a memory array. The memory array comprises a plurality of cross-point memory cells, and each cross-point memory cell comprises a selector and a memory element coupled in series between both terminals of the cross-point memory cell. The operating method comprises: providing, by a control circuit, at least one read pulse with an increasing magnitude to a selected cross-point memory cell; and receiving, by a read circuit, a read current flowing through the selected cross-point memory cell and determine whether the read current is greater than a target current.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A memory system, comprising:
a memory array comprising a plurality of cross-point memory cells, each cross-point memory cell comprising a selector and a memory element coupled in series between both terminals of the cross-point memory cell;
a control circuit coupled to the memory array, the control circuit being configured to provide a plurality of read pulses comprising at least two pulses with increasing magnitudes to a selected cross-point memory cell; and
a read circuit coupled to the memory array, the read circuit being configured to receive a plurality of read currents flowing through the selected cross-point memory cell respectively in response to provisions of the read pulses, and is configured to verify whether each of the read pulses successfully reads out data by determining whether each of the read currents is greater than a target current, the target current being a constant value.

2. The memory system of claim 1, wherein after the read circuit determines that a verified read current of the read currents is greater than the target current, the read circuit provides a verification signal to inform the control circuit stop sending read pulses.

3. The memory system of claim 1, wherein the magnitudes of read pulses are increased from a first magnitude lower than a threshold voltage of the selected cross-point memory cell to a second magnitude lower than a set voltage and greater the threshold voltage of the selected cross-point memory cell.

4. The memory system of claim 1, wherein each cross-point memory cell is a magnetic random-access memory (MRAM) cell or a resistive random-access memory (RRAM) cell.

5. The memory system of claim 1, wherein the read circuit comprises:
a sense amplifier configured to compare a verified read current with a reference current, different from the target current, to determine a data value stored in the selected cross-point memory cell.

6. The memory system of claim 5, wherein a current level of the reference current is positively correlated to the magnitude of the read pulse.

7. The memory system of claim 6, wherein read circuit further comprises:
a reference current source configured to provide the reference current to the sense amplifier, the reference current source comprising a plurality of sub-current sources coupled in parallel, each sub-current source being controlled by a control signal to selectively provide a sub-current, so that the sub-currents are summed as the reference current.

8. The memory system of claim 1, wherein the plurality of read pulses are alternating between positive and negative voltages.

9. The memory system of claim 1, wherein the read pulses comprise a preset number of first read pulses having a first magnitude and, following the first read pulses, at least one second read pulse having a second magnitude greater than the first magnitude.

10. The memory system of claim 9, wherein the read circuit is configured to provide the first read pulses having the first magnitude repeatedly after an accessed count of the selected cross-point memory cell is greater than or equal to a preset accessed count.

11. A memory system, comprising:
a memory array comprising a plurality of cross-point memory cells, each cross-point memory cell comprising a selector and a memory element coupled in series between both terminals of the cross-point memory cell;
a control circuit coupled to the memory array, the control circuit being configured to provide a plurality of read pulses to a selected cross-point memory cell, wherein magnitudes of the read pulses comprising at least two pulses are increased from a magnitude lower than a threshold voltage of the selector of the selected cross-point memory cell to another magnitude between a set voltage used to program the memory element of the selected cross-point memory cell and the threshold voltage of the selected cross-point memory cell; and
a read circuit coupled to the memory array, the read circuit being configured to receive a plurality of read currents in response to provision of the read pulses.

12. The memory system of claim 11, wherein after the read circuit determines that a verified read current of the read currents is greater than a target current, the read circuit provides a verification signal to inform the control circuit stop sending read pulses to the selected cross-point memory cell.

13. The memory system of claim 11, wherein the read circuit comprises:
a sense amplifier configured to compare a verified read current with a reference current, different from the target current, to determine a data value stored in the selected cross-point memory cell.

14. The memory system of claim 13, wherein the reference current has a fixed current level.

15. The memory system of claim 13, wherein a current level of the reference current is positively correlated to the magnitude of the read pulse.

16. The memory system of claim 15, wherein read circuit further comprises:
a reference current source configured to provide the reference current to the sense amplifier, the reference current source comprising a plurality of sub-current sources coupled in parallel, each sub-current source being controlled by a control signal to selectively provide a sub-current, so that the sub-currents are summed as the reference current.

17. The memory system of claim 11, wherein the plurality of read pulses are alternating between positive and negative voltages.

18. The memory system of claim 11, wherein the read pulses comprise a preset number of first read pulses having a first magnitude and, following the first read pulses, at least one second read pulse having a second magnitude greater than the first magnitude.

19. The memory system of claim 18, wherein the read circuit is configured to provide the first read pulses having the first magnitude repeatedly after an accessed count of the selected cross-point memory cell is greater than or equal to a preset accessed count.

20. An operating method of a memory array, the memory array comprising a plurality of cross-point memory cells, each cross-point memory cell comprising a selector and a memory element coupled in series between both terminals of the cross-point memory cell, the operating method comprising:
providing, by a control circuit, a plurality of read pulses with increasing magnitudes to a selected cross-point memory cell; and receiving, by a read circuit, a plurality of read currents flowing through the selected cross-point memory cell respectively in response to provisions of the read pulses, and verifying whether each of the read pulses successfully reads out data by determining whether each of the read currents is greater than a target current, the target current being a constant value.

* * * * *